United States Patent [19]

Rhee

[11] Patent Number: 4,490,683

[45] Date of Patent: Dec. 25, 1984

[54] ELECTRONIC CONTROL SWITCH FOR A POWER BOOST AMPLIFIER

[75] Inventor: Dennis W. Rhee, Bloomfield Hills, Mich.

[73] Assignee: Ford Motor Company, Dearborn, Mich.

[21] Appl. No.: 429,416

[22] Filed: Sep. 30, 1982

[51] Int. Cl.³ .............................................. H03G 9/02
[52] U.S. Cl. .................................. 330/51; 330/284; 330/304; 381/102; 381/120
[58] Field of Search .................. 330/51, 145, 284, 304; 333/28 R, 28 T; 381/86, 102, 103, 120; 455/267, 345

[56] References Cited

U.S. PATENT DOCUMENTS

| Re. 29,529 | 1/1978 | Heaslett | 330/107 |
|---|---|---|---|
| 3,332,041 | 7/1967 | Wilson et al. | 381/102 X |
| 3,555,192 | 1/1971 | Hymer | 179/1 |
| 3,748,584 | 7/1973 | Ribour et al. | 325/492 |
| 3,818,359 | 6/1974 | Hekimian | 333/28 R X |
| 3,924,070 | 12/1975 | Seaver | 179/1 |
| 3,956,591 | 5/1976 | Gates | 179/1 |
| 4,031,319 | 6/1977 | Desai | 381/102 |
| 4,162,457 | 7/1979 | Grodinsky | 330/295 |
| 4,182,930 | 1/1980 | Blackmer | 179/1 R |
| 4,243,837 | 1/1981 | Bertholon | 179/1 V C |
| 4,320,534 | 3/1982 | Sakai et al. | 381/102 X |

Primary Examiner—James B. Mullins
Attorney, Agent, or Firm—Paul K. Godwin, Jr.; Robert D. Sanborn

[57] ABSTRACT

An electronic amplifier control switch for controlled operation of a power amplifier connected to the output of an audio signal generating device and having an associated electronic equalizer/attentuator switching circuit that is switchable between its two modes by a manually settable switch.

4 Claims, 2 Drawing Figures

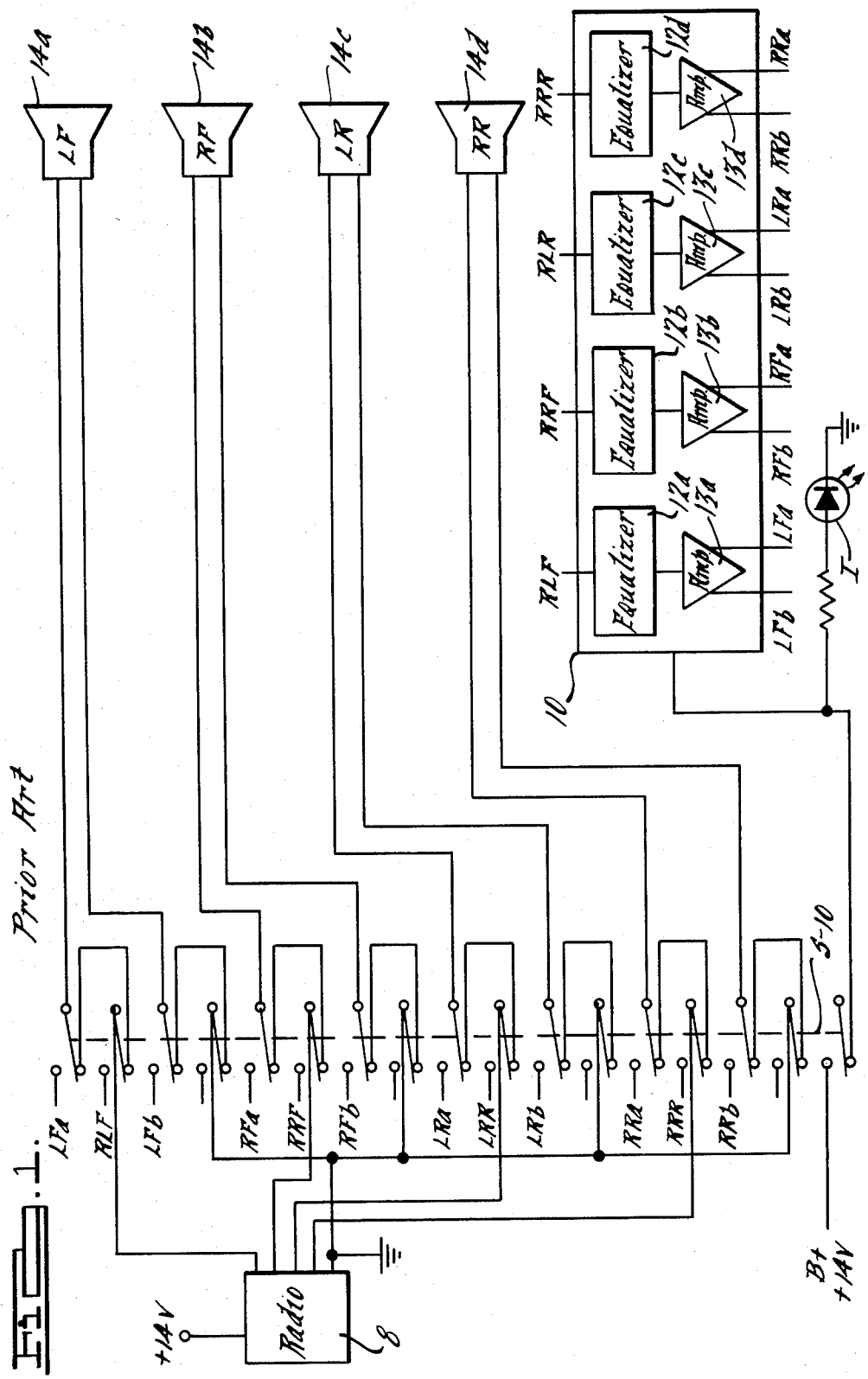

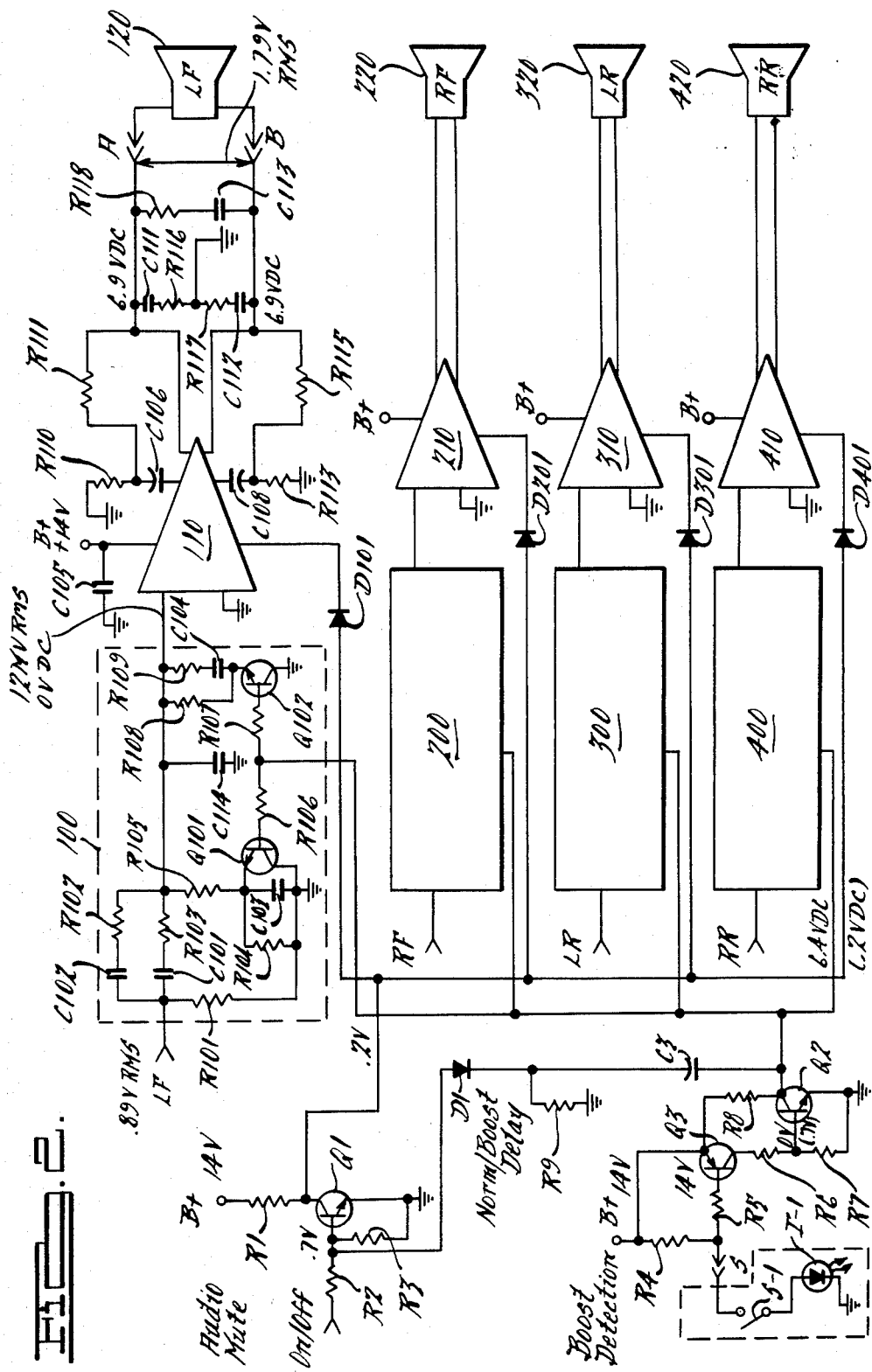

ELECTRONIC CONTROL SWITCH FOR A POWER BOOST AMPLIFIER

BACKGROUND OF THE INVENTION

1. Field of the Invention

The present invention is directed to the field of audio amplification and more specifically to the area of control switching of amplifiers.

2. Description of the Prior Art

Recently, in vehicular audio systems, power amplification modules have been offered as optional equipment to be added to the conventional radio. Such installations, as exemplified in FIG. 1, included a power amplifier module 10 and a 17-pole double-throw switch S10 wired between the conventional radio receiver and the output speakers associated therewith. The functions of the power amplifier unit 10 were to provide an equalizer network 12 for each channel of audio signal output from the radio receiver 8 and to boost the power of that signal to each associated speaker. The function of the equalizer network 12 was to enhance certain frequencies of audio signal output from the radio 8 for each channel and was conventionally designed to highlight certain frequencies over others, depending upon the vehicle in which it was intended to be installed. This involved tuning according to the amount and placement of both accoustically absorbing material and accoustically reflecting material which make up the interior of the vehicle. The output of the equalizer network was then fed to a power amplifier 13 which in turn produced an amplified signal used to drive a single speaker through switch S10.

The switch S10, used in these prior art installations, was relatively large and expensive since the contacts thereof were required to handle audio signals and relatively high current levels without introducing noise to the system. The system was further burdensome in that a considerable amount of labor was necessary to interconnect the large number of wires between the radio and the switch, between the switch and the speakers, between the switch and the input of the amplifier module 10 and between the output of the module 10 and the switch. Cost of components, fabrication labor and installation labor were all factors which added to the cost of this option.

SUMMARY OF THE INVENTION

The present invention is intended to improve the power amplifier feature of the prior art by continuing to provide a manually activated electronic switch means to control the normal or power boost modes of the audio system while at the same time reducing the fabrication complexity of the switch and reducing the amount of wiring to interconnect the system.

The present invention achieves its objectives by providing an electronic equalization/attenuation switching circuit that is electronically controlled by a circuit to attenuate the signal from the source, such as a radio receiver, prior to amplification by the power amplifier when a manually actuated mode select switch is in the normal mode position, and controlled to provide an equalization that enhances the frequency output of the audio signal from the source, without significant attentuation, when a manually actuated mode select switch is in the power boost mode position.

Electronic on/off switching of the power amplifier is performed in conjunction with the associated radio receiver power switch to eliminate power current switching external to the power amplifier.

A delay circuit is provided connected to the electronic control circuit for the electronic equalization/attentuation switching circuit to provide a short period of time in which the power amplifier is electronically turned off when the equalization/attenuation switching circuit is controlled to change from its normal-attentuation mode to the power boost-equalization mode to thereby eliminate electronic switching noise from being amplified by the power amplifier. In addition, the application of power boost after the quiet pause provided by the audio mute delay further enhances the quality of sound to the listener.

Electronic switching noise is minimized when reverse switching of the equalization/attenuation switching circuit occurs back to the normal-attenuation mode by providing reverse connected transistors that are activated in the normal-attentuation mode.

BRIEF DESCRIPTION OF THE DRAWINGS

FIG. 1 is a wiring diagram of a prior art system for which the present invention is an improvement.

FIG. 2 is a schematic-block diagram of a preferred embodiment of the present invention.

DETAILED DESCRIPTION OF THE PREFERRED EMBODIMENT

The present invention, as shown in FIG. 2, is being incorporated with a radio receiver (not shown) in a four-channel audio system in which each channel controls a separate speaker within the vehicle. The speakers and channels are designated as left front (LF), right front (RF), left rear (LR) and right rear (RR). The left front amplifier module associated with the left front channel is detailed and the other amplifier modules associated with the other three channels are shown in block diagram format, since they are identical in construction. The four channels each receive different audio signals from the radio receiver according to the setting of balance (left to right) and fader (front to rear) controls within the radio receiver. In the left front channel the LF signal from the radio receiver enters the equalization/attenuation circuit 100 and, depending upon the biasing of reverse connected NPN transistors Q101 and Q102, the signal is either attenuated by a known factor of is frequency enhanced through several tuning networks to accentuate certain frequencies within the audio range. The output of the equalization-/attenuation circuit 100 is fed directly to the amplifier 110 which is preferably a bridged transformer-less type amplifier providing a high gain output that is communicated to an associated speaker 120.

The amplifier 110 is connected directly to the B+ supply of 14 volts DC and is electronically controllable to be either in a stand-by state in which the amplifier circuitry draws only minimal current from the B+ supply and provides no amplification or is in a normal operating state in which it provides amplification of the signal input thereto. The state of operation of the amplifier 110 is controlled from the on/off control switch of the radio receiver through an audio mute circuit comprising input resistor R2, biasing resistor R3 and NPN transistor Q1. Transistor Q1 has its base connected to the junction of resistors R2 and R3 and has its emitter connected to the other side of resistor R3 and ground. The collector of transistor Q1 is connected to the B+ power supply through resistor R1 and is also connected to diode D101 to control the operational state of amplifier 110. Therefore, when the receiver is turned on or off the transistor Q1 is correspondingly biased to either a saturated state or a non-conducting state so as to provide one of two voltages to a pin of amplifier 110, which will cause it to be electronically switched to its corresponding stand-by or operating state. In this manner, it is not necessary to provide high current switching between the receiver and the amplifier module nor is it necessary to provide a separate power switch to the amplifier in order to avoid wasted energy when the amplifier is not in use.

Switch S-1 is mounted within the vehicle for manual operation, separate from the on/off control switch of the radio receiver, so as to provide the selected mode of system operation. In the normal mode of operation, a true reproduction of the radio produced signal is made, while in the power boost mode, an enhanced and amplified version of the radio produced signal is fed to the speakers. In the drawing, these are designated as "Normal" mode and "Boost" mode respectively.

When the switch S-1 is in the open position, associated transistors Q2 and Q3 of an electronic control circuit are biased in an off condition providing for approximately 6.4 volts DC to be applied to the electronic equalization/attentuation switching circuit 100 at the junction between resistors R106 and R107. The voltage present at the junction biases associated NPN transistors Q101 and Q102 in a saturated condition. The transistors Q101 and Q102 are reverse connected with their collectors grounded so as to provide low noise to the network when the transistors are switch biased from an off to a saturated condition. It was found that the voltage drop across the transistors when connected in this configuration is on the order of 0.002 volts, as compared with 0.2 volts when the emitter is connected to ground.

When transistors Q101 and Q102 are saturated, the attenuation circuit is dominant wherein a path is completed through each to ground to provide signal leakage paths across resistors 105 and 108. Capacitor C101 provides for the LF signal from the radio receiver to be coupled to the attentuation circuit. Resistor R103, in combination with resistors R105 and R108 connected through the respective transistors to ground, provides the attentuation circuit in this Normal mode.

In this example, the amplifier 110 provides amplification to input signals by a factor of 4. Therefore, when the system is in the Normal mode of operation, as dictated by S1 being in an open position, the LF signal is reduced by a factor of 2 prior to being input to the amplifier 110. Assuming the radio receiver is turned on with switch S1 open, the amplifier 110 is in its Normal mode of operation and amplifies the attentuated input signal to provide an output to the speaker 120 which, in essence, reproduces that amplified signal at the same level as input from the radio receiver to the attentuation circuit.

When the switch S1 is closed and after a slight delay, the system enters the Boost mode. The transistors Q2 and Q3 are biased to a saturated condition and an indicator lamp (LED) I-1 is energized to indicate to the operator that the system is in the Boost mode. As transistor Q2 reaches its saturated condition, the voltage level at its collector drops to approximately 0.2 volts DC. The change in voltage level creates a spike to cause forward biasing on diode D1 that pulls down the base of Q1 for a period of time determined by the R9, C3 network to thereby electronically mute amplifier 101 for that short time period. This is especially necessary when the power switch is turned from off to on by closing S1 in order to avoid a loud popping noise from being heard in the output of amplifier 110. Saturated Q2 causes transistors Q101 and Q102 to be switch biased to a nonconducting state. When Q101 is in the nonconducting state, resistor R-104 and parallel capacitor C-103 are effectively switched into the circuit in series with resistor 105. Resistor R-104 with capacitor C-103; capacitor C-102 in series with resistor R-102; and resistor R-109 in series with C-104, form portions of the equalizing circuit for the purpose of boosting the high and low ends of the responsive range so as to enhance the audio signal entering the amplifier circuit. That enhanced signal is then amplified by the amplifier 110 and is output in a push/pull output stage to the speaker 120. The electronic equalization/attenuation switching circuits 200, 300 and 400 operate in the same manner as circuit 100 and are respectively connected to receive the RF, LR and RR channel audio signals from the radio receiver. Those equalization/attenuation circuits respectively feed to the input of amplifiers 210, 310 and 410 which in turn respectively drive speakers 220, 320 and 420.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. An amplifier control switch comprising: means for providing a variable electrical signal in the audio frequency range at a level determined by said variable signal providing means;

means for amplifying said variable signal by a predetermined factor;

means connected to the output of said amplifying means for mechanically reproducing the amplified variable signal;

means between said variable signal providing means and said amplifying means having a plurality of selective circuits including an attentuator circuit for proportionally attenuating said variable signal from said variable signal providing means prior to its input to said amplifying means so that said amplifying means outputs a signal at approximately the same level as output from said variable signal providing means and an equalizing circuit for enhancing said variable signal from said variable signal providing means prior to its input to said amplifying means over a predetermined frequency range without significant attentuation; and means connected to said selective circuit means for selecting one of either of said attentuator circuit or said equalizing circuit to correspondingly supply an attentuated or enhanced variable input signal to said amplifying means.

2. An amplifier control switch as in claim 1 further including means connected between said selecting means and said amplifying means for muting said amplifying means for a predetermined period of time when said selecting means selects said equalizing circuit.

3. An amplifier control switch for use in conjunction with an audio signal generating device and an audio amplifier comprising:

first circuit means between said audio signal generating device and said audio amplifier defining both an attenuation circuit which reduces the amplitude of said audio signal from said audio signal generating device to a sufficiently low level that the output of said audio amplifier is an audio signal having approximately the same amplitude as the output from said audio signal generating device and a frequency equalization circuit which provides frequency enhancement of the audio signal output from said audio signal generating device without significant attenuation to said audio amplifier; and means connected to said first circuit means for electronically selecting one of said defined attenuation or frequency equalization circuits to effect said audio signal input to said audio amplifier.

4. An amplifier control switch as in claim 3 further including means connected between said selecting means and said amplifier for muting the output of said amplifier for a predetermined period of time when said selecting means selects said frequency equalization circuit.

* * * * *

UNITED STATES PATENT AND TRADEMARK OFFICE
CERTIFICATE OF CORRECTION

PATENT NO. : 4,490,683
DATED : December 25, 1984
INVENTOR(S) : Dennis W. Rhee

It is certified that error appears in the above–identified patent and that said Letters Patent are hereby corrected as shown below:

Title page, item [75] should read as follows:

-- Inventors: Dennis W. Rhee, Bloomfield Hills, Mich.;
Thomas R. Southworth, Riverview, Mich.; and
Brian C. Elias, Dearborn, Mich. --.

Signed and Sealed this

Fourteenth Day of May 1985

[SEAL]

Attest:

DONALD J. QUIGG

Attesting Officer

Acting Commissioner of Patents and Trademarks